United States Patent [19]

Liu

[11] 4,330,931
[45] May 25, 1982

[54] PROCESS FOR FORMING METAL PLATED REGIONS AND LINES IN MOS CIRCUITS

[75] Inventor: Sheau-Ming S. Liu, Los Altos, Calif.

[73] Assignee: Intel Corporation, Santa Clara, Calif.

[21] Appl. No.: 231,121

[22] Filed: Feb. 3, 1981

[51] Int. Cl.³ .............................................. H01L 21/26
[52] U.S. Cl. .................................. 29/571; 29/576 B; 29/578; 29/590; 148/1.5; 148/187
[58] Field of Search ..................... 29/571, 576 B, 578, 29/590; 148/1.5, 187

[56] References Cited

U.S. PATENT DOCUMENTS

| | | | |
|---|---|---|---|
| 2,750,541 | 6/1956 | Ohl | 148/1.5 X |
| 3,615,935 | 10/1971 | O'Keeffe et al. | 148/1.5 X |
| 3,999,281 | 12/1976 | Goronkin et al. | 29/571 |
| 4,013,489 | 3/1977 | Oldham | 148/1.5 X |
| 4,026,733 | 5/1977 | Owen et al. | 148/1.5 |
| 4,033,026 | 7/1977 | Pashley | 29/571 |
| 4,182,023 | 1/1980 | Cohen et al. | 29/571 |
| 4,198,250 | 4/1980 | Jecmen | 148/1.5 |
| 4,272,308 | 6/1981 | Varshney | 148/187 |

Primary Examiner—G. Ozaki
Attorney, Agent, or Firm—Blakely, Sokoloff, Taylor & Zafman

[57] ABSTRACT

A process for forming self-aligned, metal plated substrate regions and polysilicon members is described. Oxide lips or borders are formed along the sides of the polysilicon members beneath a masking member. An oxide damaging ion bombardment is used to damage the oxide on the substrate, however, the oxide lips remain protected because of the overlying masking member. A controlled etch is used to remove the damaged oxide leaving the polysilicon member separated from adjacent regions by the oxide lips. A tungsten deposition is used to form metal plating over the exposed substrate regions and over the polysilicon member, however, no metal is formed over the oxide lips.

13 Claims, 7 Drawing Figures

PROCESS FOR FORMING METAL PLATED REGIONS AND LINES IN MOS CIRCUITS

BACKGROUND OF THE INVENTION

1. Field of the Invention

The invention relates to the field of metal plated integrated circuit regions and members.

2. Prior Art

There has been a continual effort in the semiconductor industry to produce integrated circuits which operate at higher speeds and at a lower power levels. In metal-oxide-semiconductor (MOS) fabrication, several techniques are used to provide low resistance lines and regions. In some instances, metal lines are used instead of polycrystalline silicon (polysilicon) lines since metal lines typically have a lower resistance when compared to polysilicon. In other instances, heavier doping is used, both for the polysilicon and substrate regions to provide higher conductivity. One process for forming low resistance interconnections is described in U.S. Pat. No. 4,013,489.

As will be seen, the present invention provides a process for forming self-aligned, metal plated substrate regions and adjacent polysilicon lines. In the presently preferred embodiment, tungsten is used as the metal. The specific process for forming the tungsten layer is commercially available and marketed by AMT. With this commercial process, tungsten is formed over monocrystalline silicon and polysilicon but not over silicon dioxide or silicon nitride.

SUMMARY OF THE INVENTION

A process for forming a metal covered substrate region and a metal covered polysilicon member adjacent to the region is described. A polysilicon member is formed on the substrate from a masking member. Then the substrate is subjected to an oxidation step which oxidizes the sides of the polysilicon member as well as the region of the substrate adjacent to the polysilicon member. The substrate is then subjected to an oxide damaging ion bombardment which damages all exposed oxide surfaces. However, the oxidized sides of the polysilicon member are protected by the overlying masking member and thus are not damaged. Then, the damaged oxide and masking member are removed, thereby exposing the region of the substrate as well as the upper surface of the polysilicon member. A metal layer is now formed on the exposed substrate region and the exposed surface of the polysilicon member. No metal is formed over the oxide sides of the polysilicon member. In this manner, a metal covered substrate region is formed as well as a metal covered polysilicon member which are self-aligned.

DETAILED DESCRIPTION OF THE PRESENT INVENTION

A process for forming metal plated regions and polysilicon members during the fabrication of an MOS integrated circuit is described. In the following description, numerous specific details such as specific energy levels, thicknesses and conductivity types are set forth to provide a thorough understanding of the present invention. However, it will be obvious to one skilled in the art that the present invention may be employed without these specific details. In other instances, well-known processing steps have not described in detail in order not to obscure the present invention in unnecessary detail.

In the following description the fabrication of an MOS, field-effect transistor is described. The polysilicon gate member of the transistor and the adjacent source and drain regions of the transistor are metal plated with tungsten. It will be obvious to one skilled in the art, that other integrated circuit devices may be fabricated in a similar manner using the invented processing.

Figure 1:
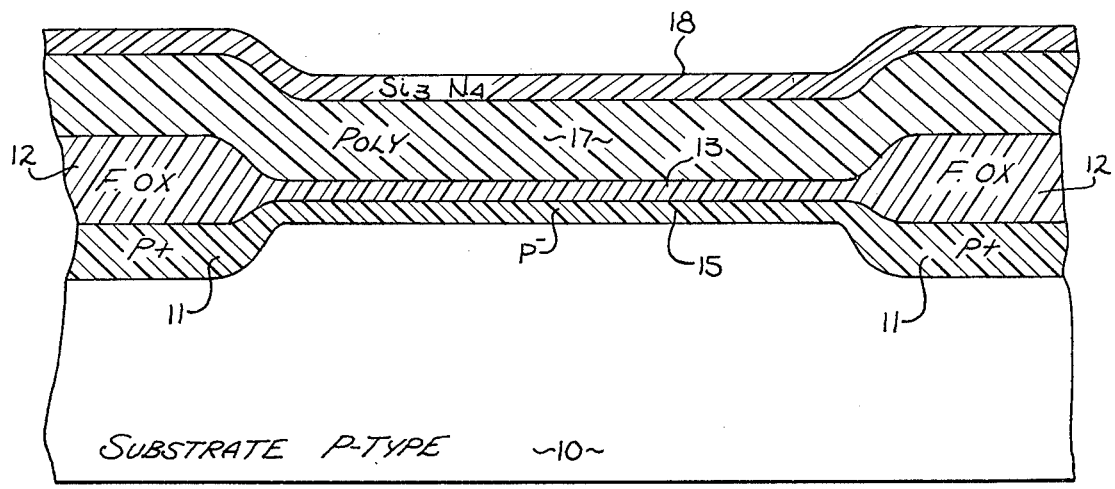
FIG. 1 is a cross-sectional elevation view of a substrate which includes channel stops, an ion implanted surface, field oxide regions, gate oxide layer, a polysilicon layer, and a silicon nitride layer.

Referring now to FIG. 1, a substrate 10 is illustrated after commonly employed "front-end" processing. In the presently preferred embodiment, a monocrystalline silicon substrate 10 is employed. This low resistivity substrate (50 ohm-cm) is processed to form commonly employed field-oxide regions 12 with underlying P+ channel stops 11. The substrate is subjected to a threshold adjusting ion implantation to form the P− region 15. A gate oxide (silicon dioxide) layer 13 which in the presently preferred embodiment is 250 A thick is formed over the substrate. Then a polysilicon layer 17 of approximately 3000 A thick for the presently preferred embodiment is formed over the gate oxide layer 13 and doped with phosphorus. Following this, a silicon nitride ($Si_3N_4$) layer 18 is formed over the polysilicon layer. The silicon nitride layer is used, as will be described, for forming a masking member. The silicon nitride layer as presently preferred is approximately 250 A thick, or thicker.

While not critical, the substrate with the layers of FIG. 1 is subjected to an oxidation step at approximately 920° C. for 30 minutes (dry atmosphere) to seal off pin-holes in the silicon nitride layer.

While not shown, it will be appreciated that other processing may occur in other areas of the substrate, for example, buried contact regions may be formed with an additional masking step to provide contact between the polysilicon layer 17 and regions of the substrate.

Figure 2:
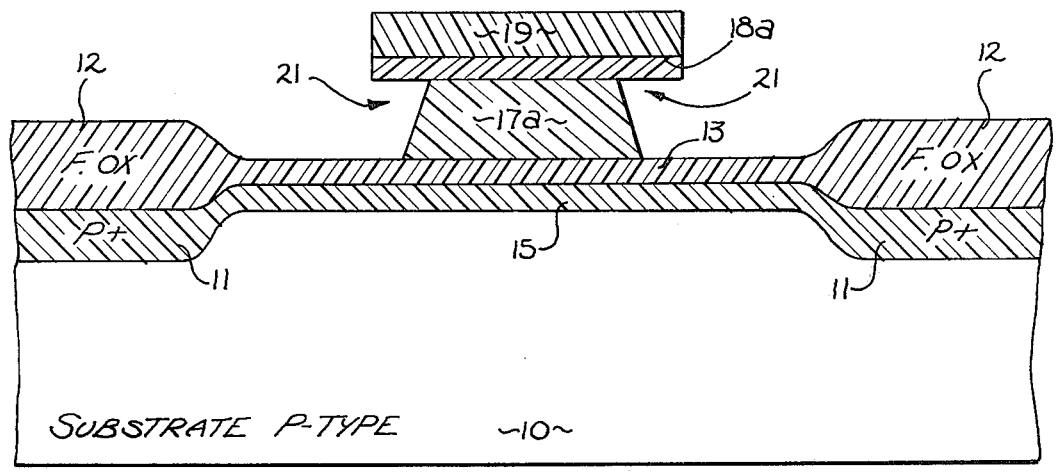
FIG. 2 illustrates the substrate of FIG. 1 after a gate member has been etched from the polysilicon layer.

Now, a photoresist layer is formed over the silicon nitride layer 18 and through use of ordinary photolithographic techniques, a masking member 19 (FIG. 2) is formed over the silicon nitride layer and then the silicon nitride layer is etched in alignment with the masking member 19 to form an additional masking member 18a. In the presently preferred embodiment, a plasma etch is used to etch the silicon nitride layer.

Next, the polysilicon layer 17 is etched to form the gate member 17a. A wet etch or a plasma etch may be employed. In the presently preferred process, the etching is continued to permit undercutting beneath the masking member 18a to form the undercuts 21. The photoresist masking member 19 is removed; this removal may occur prior to the etching of the polysilicon layer.

Figure 3:
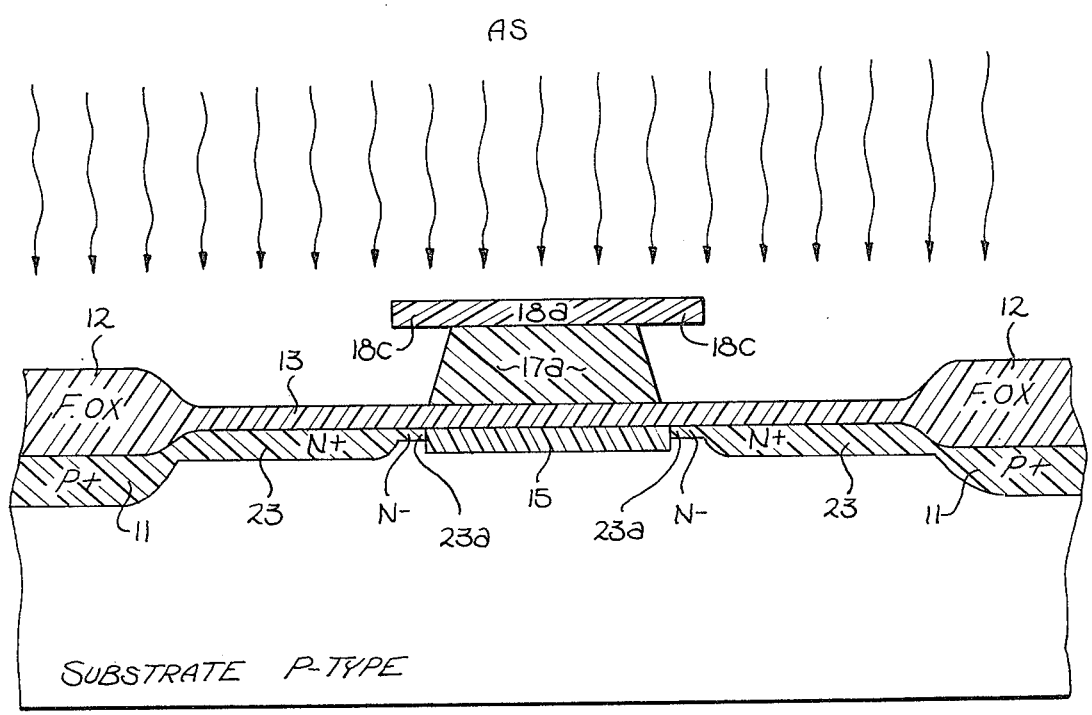
FIG. 3 illustrates the substrate of FIG. 2 with the substrate subjected to an ion implantation step used to define source and drain regions.

As shown in FIG. 3, the substrate is now subjected to an arsenic implant to form the source and drain regions 23. In the presently preferred embodiment, this implant occurs through the oxide layer at an energy level of 80 KeV to a doping level of $4 \times 10^{15}$ Cm$-2$. The silicon nitride overhangs 18c shown in FIG. 3, block most of the ions and more lightly doped regions 23a are formed directly adjacent to the gate member 17a. During subsequent processing steps, particularly high temperature steps, less lateral diffusion occurs from the more lightly doped regions 23a, and thus there is less diffusion of the N type dopant under the gate member 17a. This reduces the Miller capacitance and increases the speed of the circuit. Note that the threshold adjusting implant which formed the region 15 remains under the gate member. In the source and drain regions, the effects of this p-type dopant are lost in the n-type dopant.

The process for forming the overhangs, and the more lightly doped regions 23a is described in detail in U.S. Pat. No. 4,198,250.

Figure 4:
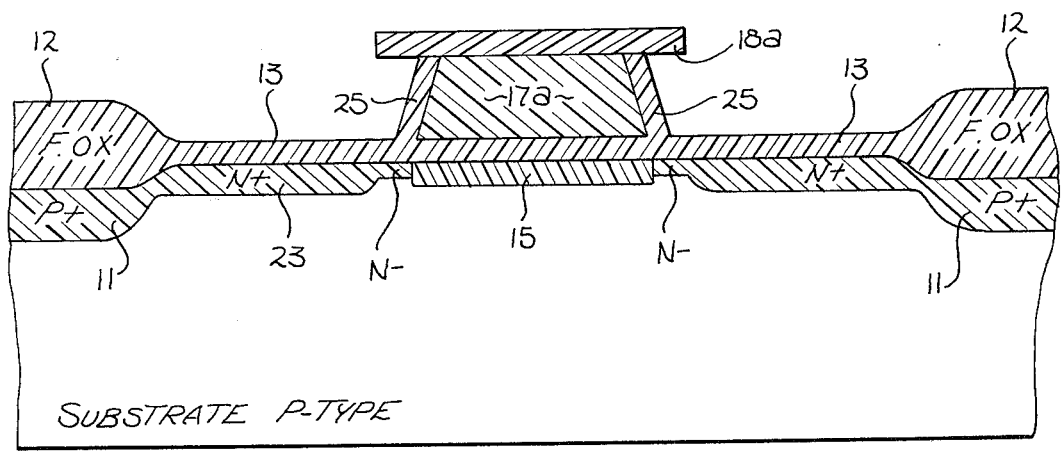
FIG. 4 illustrates the substrate of FIG. 3 after an oxidation step used to form oxide lips on the gate member.

The substrate is now subjected to an oxidation step at a temperature of 920° C. (dry atmosphere) for three hours. This drives in the arsenic dopant. Importantly, as shown in FIG. 4, this oxidation step forms an oxide (silicon dioxide) on the sides of the polysilicon gate member 17a which is approximately 1000 A thick. In effect, lips 25 are formed on the sides of the gate member. This oxidation step thickens the exposed portions of the gate oxide layer 13 (a thicker oxide may be used).

Figure 5:
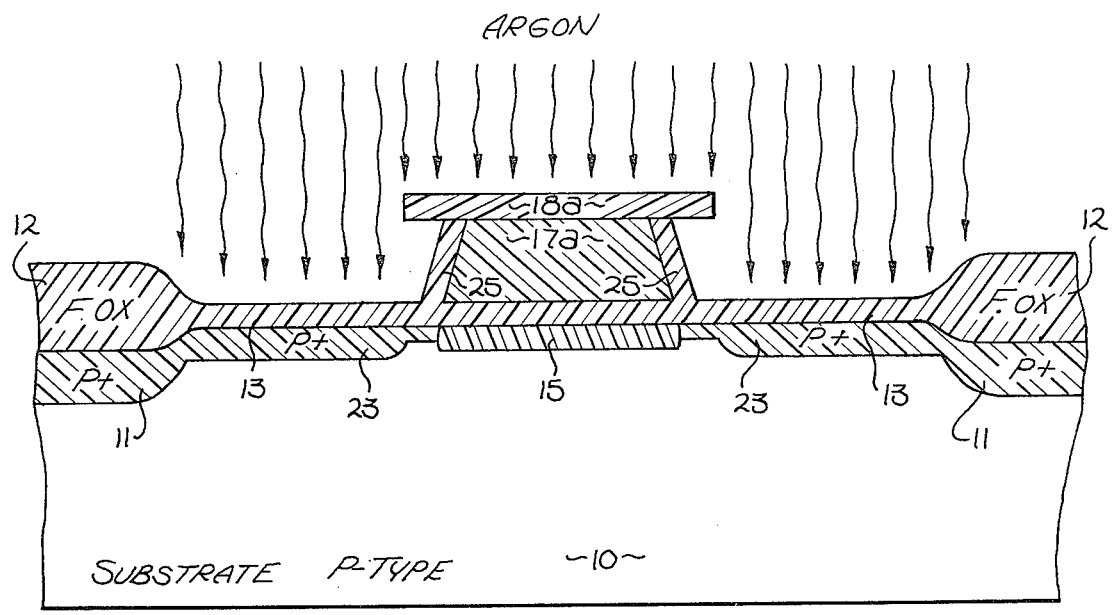
FIG. 5 illustrates the substrate of FIG. 4 with the substrate subjected to ion bombardment used to damage exposed oxide surfaces.

Referring now to FIG. 5, the substrate is subjected to an ion bombardment which is used to damage the oxide layer 13. (Note that the upper regions of the field oxide 12 are also damaged by the ion bombardment.) In the presently preferred embodiment, an argon ion bombardment is used at an energy level of 50 KeV to obtain a concentration level of $2 \times 10^{15}$ Cm$-2$. A phosphorus ion or other ions may be used. The silicon nitride masking member 18 blocks the ion bombardment and prevents the oxide lips 25 from being damaged by the ions.

Figure 6:
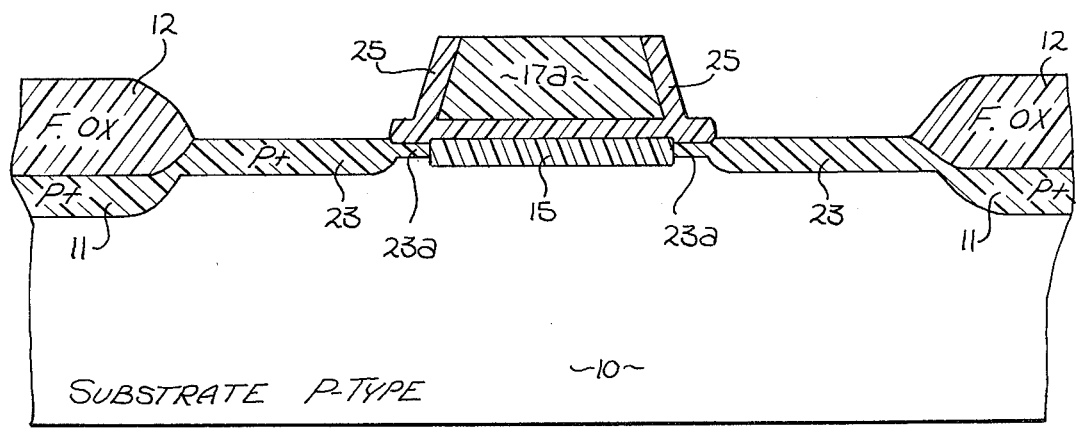
FIG. 6 illustrates the substrate of FIG. 5 after the damaged oxide and masking member have been removed.

As shown in FIG. 6, a silicon nitride etchant is used to remove the silicon nitride member 18a. Also an oxide etchant such as HF is used to remove the damaged oxide. The damaged oxide etches at a much faster rate than the undamaged oxide. This etching step is controlled to assure that all the damaged oxide is removed. However, this etching step does not remove the lips 25 although the width of these lips may be reduced. Now the substrate includes the exposed source and drain regions 23 and also the exposed upper surface of the polysilicon gate member 17a.

While not necessary, the substrate may now be subjected to a phosphorous doping step to provide deeper source and drain regions. If this is done, an additional light HF dip is used to clean off any oxide which forms over the source and drain regions and gate member 17a during this doping step.

The substrate is now subjected to a metal deposition step which in the presently preferred embodiment is a low pressure, low temperature, chemical vapor deposition step commercially available from AMT Corporation. With this process, tungsten is formed over all exposed silicon regions including polysilicon members. However, the tungsten does not form over oxide regions or for that matter, over silicon nitride members, if any. In the presently preferred embodiment, the tungsten is between 1500-2000 A thick. Other metals may be used, particularly refractory metals.

Figure 7:
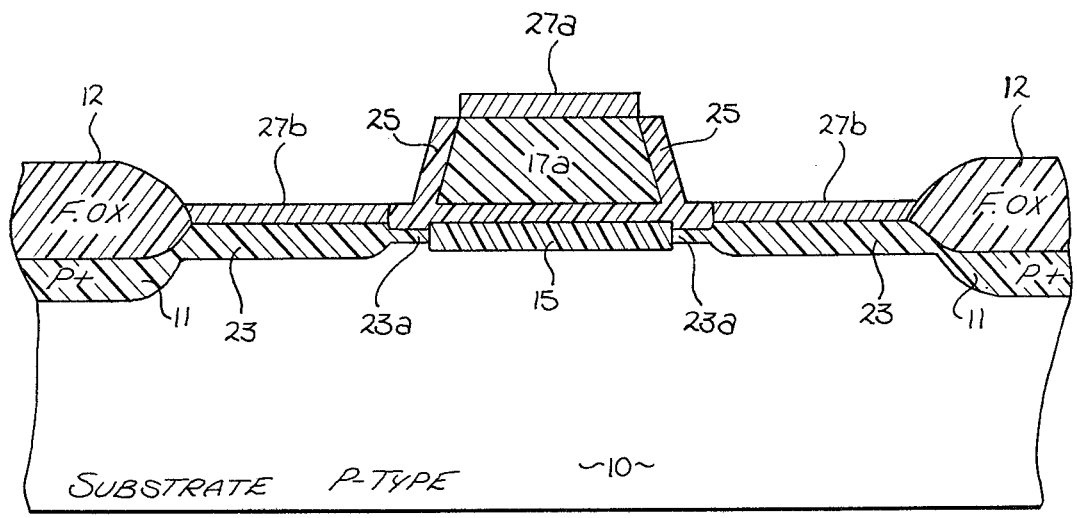
FIG. 7 illustrates the substrate of FIG. 6 after metal has been formed over exposed substrate regions and the upper surface of the polysilicon gate member.

As seen in FIG. 7, the resultant structure includes metal 27a formed over the gate member 17a and metal 27b formed over the source and drain regions 23. The oxide lips 25 provide a barrier and prevent the metal from forming between the gate member 17a and source and drain regions 23. Thus, with the above process, self-aligned metal plated substrate regions and adjacent polysilicon members may be formed.

The transistor of FIG. 7 which now includes a source and drain region and gate member 17a can be completed with well-known "rear-end" steps. In the presently preferred embodiment, low temperature steps are employed.

Thus, a process has been described for forming metal plated, self-aligned, doped substrate regions and polysilicon members.

I claim:

1. A process for forming a metal covered substrate region and a metal covered polysilicon member adjacent to said region, comprising the steps of:
    forming said polysilicon member from a polysilicon layer with a masking member;
    subjecting said substrate to an oxidation step such that an oxide layer is formed on the sides of said polysilicon member and on said substrate region adjacent to said member;
    subjecting said substrate to an oxide damaging ion bombardment such that said sides of said member are protected by said masking member;
    removing said damaged oxide and masking member so as to expose said region and the upper surface of said member; and
    forming a metal layer over said exposed region and said exposed surface of said member;
    whereby a metal covered region and metal covered polysilicon member are formed.

2. The process defined by claim 1 wherein said metal layer comprises tungsten.

3. The process defined by claim 1 wherein said masking member comprises silicon nitride.

4. In the fabrication of metal-oxide-semiconductor devices, a process for forming self-aligned metal covered doped substrate regions and self-aligned metal covered polysilicon members, with said metal covering said regions and polysilicon members being non-continuous between said regions and polysilicon member, comprising the steps of:
    forming a doped polysilicon layer over said substrate;
    forming a masking member over said polysilicon member to define said polysilicon member;
    etching said polysilicon layer to form said polysilicon member;
    doping said substrate to form said doped regions;
    growing an oxide layer over said substrate such that the exposed sides of said polysilicon member below said masking member become oxidized, forming lips on said polysilicon member;

subjecting said substrate to an oxide damaging ion bombardment, such that said masking member protects said lips from said bombardment;

removing said damaged oxide and said masking member, exposing said doped regions and the upper surface of said polysilicon member; and forming a metal layer over said exposed regions and said exposed surface of said polysilicon member such that said layer is non-continuous to said lips;

whereby low resistance metal lines are formed over said doped regions and said polysilicon members.

5. The process defined by claim 4 wherein said metal layer is a tungsten layer.

6. The process defined by claim 5 wherein said masking member comprises silicon nitride.

7. The process defined by claim 6 wherein said ion bombardment comprises argon ions.

8. The process defined by claim 6 wherein said ion bombardment comprises phosphorus ions.

9. The process defined by claim 6 wherein said doped regions are formed in alignment with said masking member.

10. A process for fabrication of a metal-oxide-semiconductor, field-effect transistor which includes metal covered source and drain regions and a metal covered polysilicon gate member, comprising the steps of:

growing a gate oxide layer on a substrate;

forming a doped polysilicon layer over said oxide layer;

defining said gate member from said polysilicon layer with a silicon nitride masking member;

doping said substrate in alignment with said masking member to form said source and drain regions;

growing a second oxide layer on said substrate including over second source and drain regions such that oxide lips are formed on the sides of said gate member;

subjecting said second oxide layer to an oxide damaging ion bombardment, such that said masking member prevents said lips from being damaged;

removing said damaged oxide and masking member, exposing said source and drain regions and the upper surface of said gate member; and forming a metal layer over said exposed source and drain regions and over exposed surface of said gate member;

whereby a transistor is fabricated with a metal covered gate member and source and drain regions.

11. The process defined by claim 10 wherein said metal layer comprises tungsten.

12. The process defined by claim 11 wherein said oxide damaging bombardment comprises argon ions.

13. The process defined by claim 11 including during the formation of said gate member, undercutting beneath said masking member such that said sides of said gate member are covered by said masking member.

* * * * *